United States Patent
Chen et al.

(10) Patent No.: US 8,956,893 B2
(45) Date of Patent: Feb. 17, 2015

(54) METIOD OF MAKING LED WITH BAT-WING EMITTING FIELD LENS

(71) Applicant: Advanced Optoelectronic Technology, Inc., Hsinchu Hsien 303 (TW)

(72) Inventors: Lung-Hsin Chen, Hsinchu (TW); Wen-Liang Tseng, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 19 days.

(21) Appl. No.: 13/905,155

(22) Filed: May 30, 2013

(65) Prior Publication Data

US 2013/0330854 A1     Dec. 12, 2013

(30) Foreign Application Priority Data

Jun. 8, 2012   (CN) ........................ 2012 1 0187374X (51) Int. Cl.
*H01L 21/00*     (2006.01)
*H01L 33/58*     (2010.01)
*H01L 33/54*     (2010.01)

(52) U.S. Cl.
CPC .............. *H01L 33/58* (2013.01); *H01L 33/54* (2013.01); *H01L 2933/005* (2013.01)
USPC ..................................... 438/27; 257/E33.067

(58) Field of Classification Search
CPC .. H01L 33/58; H01L 33/54; H01L 2933/0005
USPC ............................................................ 438/27
See application file for complete search history.

(56) References Cited

U.S. PATENT DOCUMENTS

| | | | |
|---|---|---|---|
| 2008/0254557 A1 | 10/2008 | Kim et al. | |
| 2009/0001405 A1* | 1/2009 | Choi | 257/99 |
| 2012/0299017 A1* | 11/2012 | Chen et al. | 257/88 |
| 2013/0062652 A1 | 3/2013 | Thompson et al. | |

FOREIGN PATENT DOCUMENTS

| | | |
|---|---|---|
| TW | 200841495 A | 10/2008 |
| TW | 200849671 A | 12/2008 |

\* cited by examiner

*Primary Examiner* — Alexander Ghyka
(74) *Attorney, Agent, or Firm* — Novak Druce Connolly Bove + Quigg LLP (57) ABSTRACT

A method for manufacturing an LED (light emitting diode) with bat-wing emitting field lens is disclosed. Firstly, a substrate is provided. The substrate includes a plurality of depressions each corresponding to a pair of electrodes. A plurality of LED chips are fastened in the depressions and electrically connected to the pairs of electrodes. A plurality of unsolidified lenses are formed in the depressions to cover the LED chips. A pressing mold including a plurality of protrusions is provided. The pressing mold is moved towards the substrate to force the protrusions of the pressing mold to insert into the unsolidified lenses. The lenses are solidified and the pressing mold is removed and concavities are defined at the lenses. The substrate is cut to obtain a plurality of separated and finished LEDs.

16 Claims, 7 Drawing Sheets

METHOD OF MAKING LED WITH BAT-WING EMITTING FIELD LENS

BACKGROUND

1. Technical Field

The present disclosure relates to methods for manufacturing LED (light emitting diode), and more particularly, to a method for manufacturing an LED with bat-wing emitting field lens.

2. Description of Related Art

LEDs (Light-Emitting Diodes) have many advantages, such as high luminosity, low operational voltage, low power consumption, compatibility with integrated circuits, easy driving, long term reliability, and environmental friendliness. Such advantages have promoted the wide use of the LEDs as a light source. Generally, lenses with bat-wing emitting field are helping increasing a lighting angle of the LEDs. Thus, lenses with bat-wing emitting fields are extensively required in the LEDs. However, typical method of making such lenses is complex, which at times cannot meet the requirement of mass production of the LEDs.

What is needed, therefore, is a simplified method for manufacturing LED lens with bat-wing emitting field.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-7, a method for manufacturing an LED 100 with bat-wing emitting field lens 30 in accordance with an embodiment of the present disclosure is shown. The method mainly includes several steps as discussed below.

Figure 1:
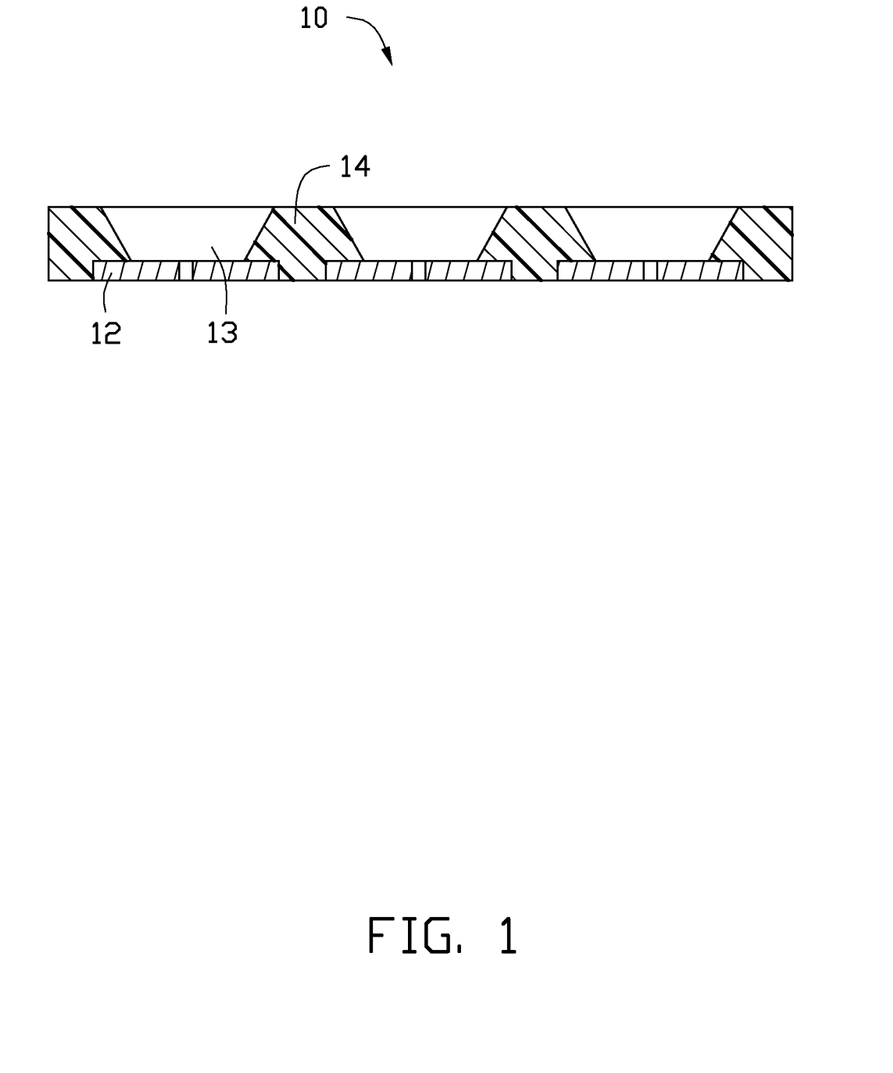
FIG. 1 shows a first step of a method for manufacturing an LED with bat-wing emitting field lens in accordance with a first embodiment of the present disclosure.

Firstly, a substrate 10 is provided as shown in FIG. 1. The substrate 10 is inlayed with a plurality pairs of electrodes 12. Each pair of electrodes 12 includes two electrically separated portions which are respectively acting as positive and negative electrodes of the LED 100. In this embodiment, the substrate 10 is inlayed with three pairs of electrodes 12. Each pair of electrodes 12 is isolated from each other by interval of isolating portions 14. In this embodiment, three isolated inverted cone-shaped depressions 13 are defined among the isolating portions 14, and respectively corresponding to the three pairs of electrodes 12. Each depression 13 corresponds to one pair of electrodes 12. Each pair of electrodes 12 is partially exposed in the corresponding depression 13. Surfaces of the insulating portions 14 defining the depressions 13 are plated with high reflective materials such that the insulating portions 14 act as reflective cups when the LEDs 100 radiate light.

Figure 2:
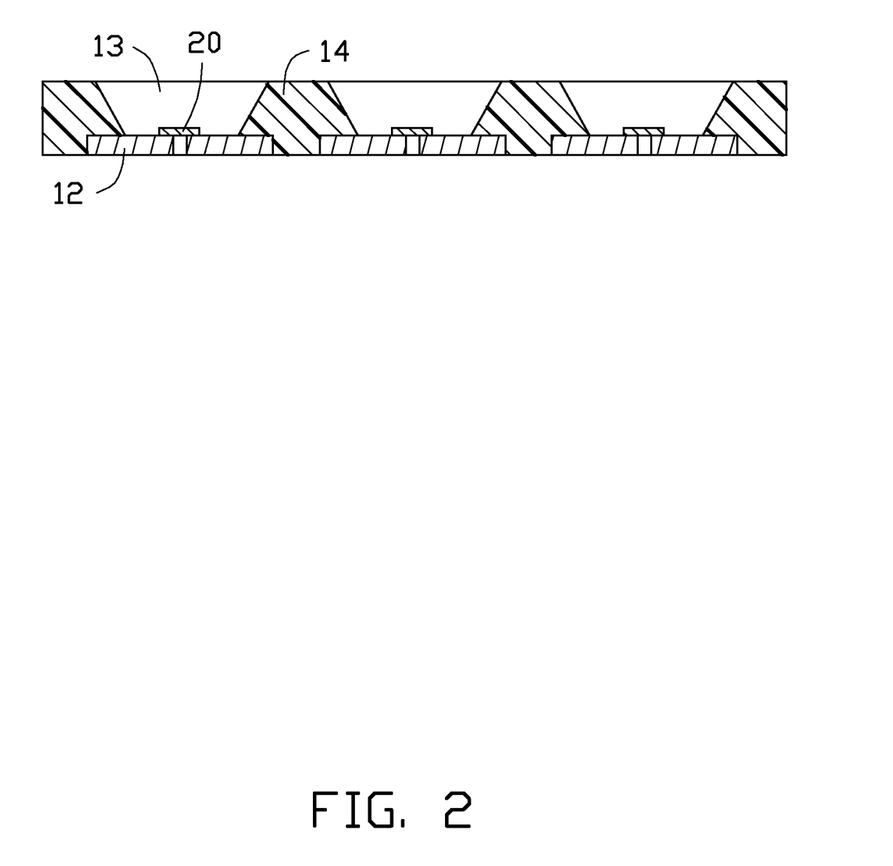
FIG. 2 shows a second step of the method for manufacturing the LED with bat-wing emitting field lens in accordance with the first embodiment of the present disclosure.

As shown in FIG. 2, LED chips 20 are fastened in the depressions 13 respectively. Each LED chip 20 electrically connects the corresponding pair of electrodes 12. It is preferred that, each LED chip 20 is fastened at a center of a bottom of the corresponding depression 13.

Figure 3:
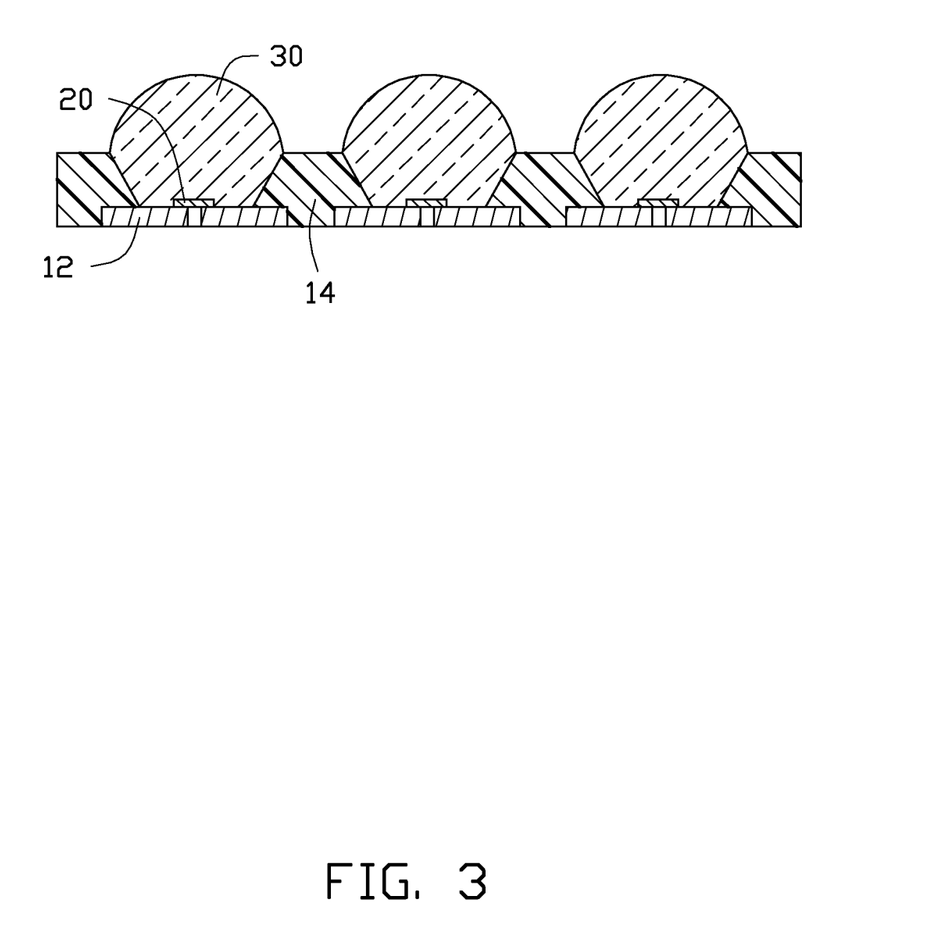
FIG. 3 shows a third step of the method for manufacturing the LED with bat-wing emitting field lens with the first embodiment of the present disclosure.

As shown in FIG. 3, lenses 30 are formed to cover the LED chips 20, respectively. The lenses 30 are formed by dispensing liquid transparent materials such as epoxy, silicone etc., in the depressions 13 to fully fill the depressions 13 and selectively protrude from the depressions 13. It is understood that the liquid transparent materials can also contain phosphor mixed therein. The LED chips 20 each are located at a central axis of a corresponding lens 30. The lenses 30 are unsolidified (uncured) at this stage.

Figure 4:
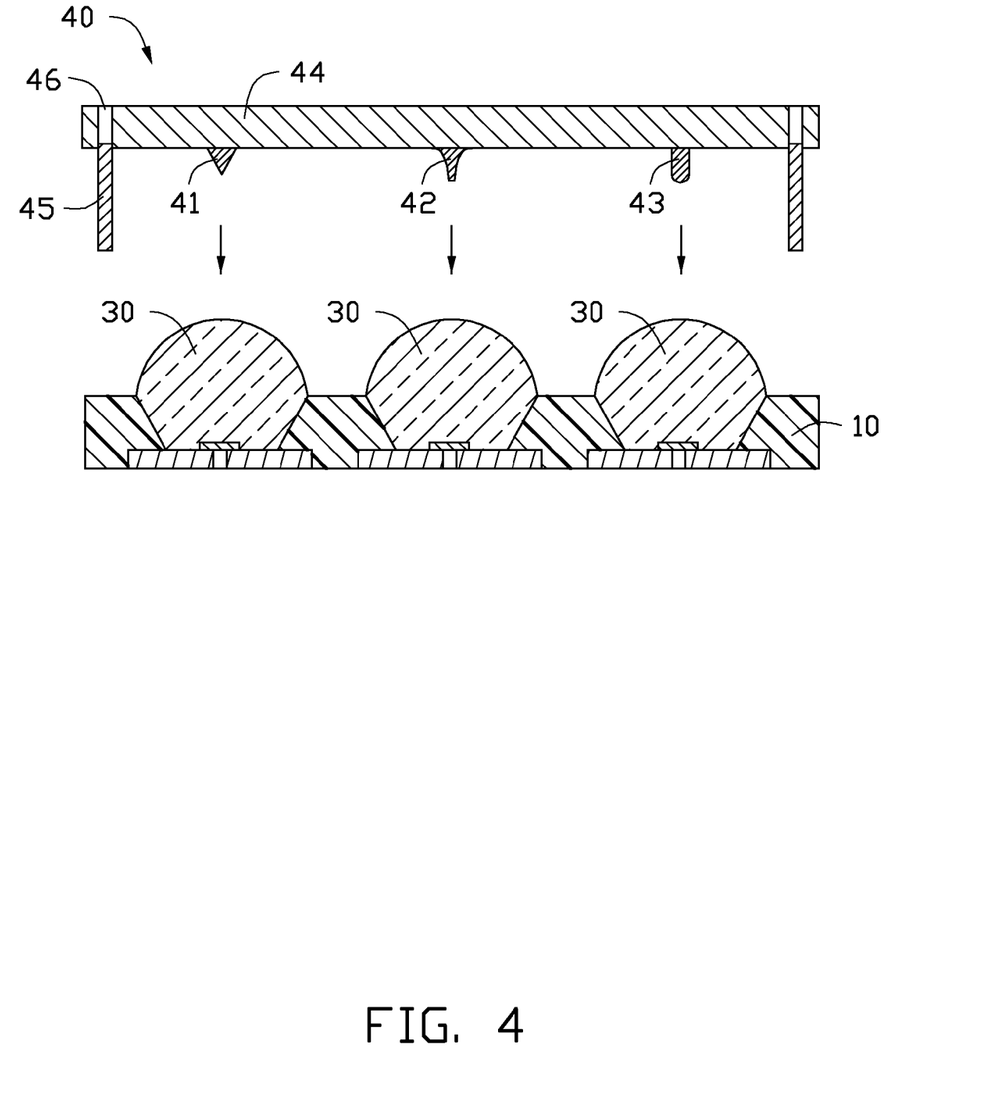
FIG. 4 shows a fourth step of the method for manufacturing the LED with bat-wing emitting field lens in accordance with the first embodiment of the present disclosure.

As shown in FIG. 4, a pressing mold 40 is provided to press the unsolidified lenses 30. The pressing mold 40 includes a supporting plate 44. A first protrusion 41, a second protrusion 42 and a third protrusion 43 protrude from a bottom surface of the supporting plate 44 and face the lenses 30 respectively. The first protrusion 41, the second protrusion 42 and the third protrusion 43 are made of metal such as stainless steel which can be easily released from the lenses 30, without incurring chemical reaction with the lenses 30 when the first, second and third protrusions 41, 42, 43 are inserted into the unsolidified lenses 30. The first protrusion 41 is inverted cone-shaped which has a triangle cross-section shown in FIG. 4. The second protrusion 42 is funnel-shaped which has a cross-section with two concave, arc-shaped side lines and a flat bottom surface shown in FIG. 4. The third protrusion 43 is bullet-shaped which has a cross-section of a rectangle with an arc bottom line shown in FIG. 4. It is preferred that, heights of the first protrusion 41, the second protrusion 42 and the third protrusion 43 are the same. Two pairs of rods 45 and guiding grooves 46 are defined at two opposite ends of the supporting plate 44 respectively. The guiding grooves 46 penetrate through opposite top and bottom surfaces along a vertical direction of the supporting plate 44. The rods 45 are capable of sliding in the corresponding guiding grooves 46 between two predetermined fixed positions in the guiding grooves 46. A length of each of the rods 45 is bigger than a depth of each of the guiding grooves 46. The length of each of the rods 45 is also bigger than a sum of the depth of each of the guiding grooves 46 and the height of each of the three protrusions 41, 42, 43. The number of the pairs of rod 45 and guiding groove 46 are not limited to two. The lenses 30 are still unsolidified at this stage.

Figure 5:
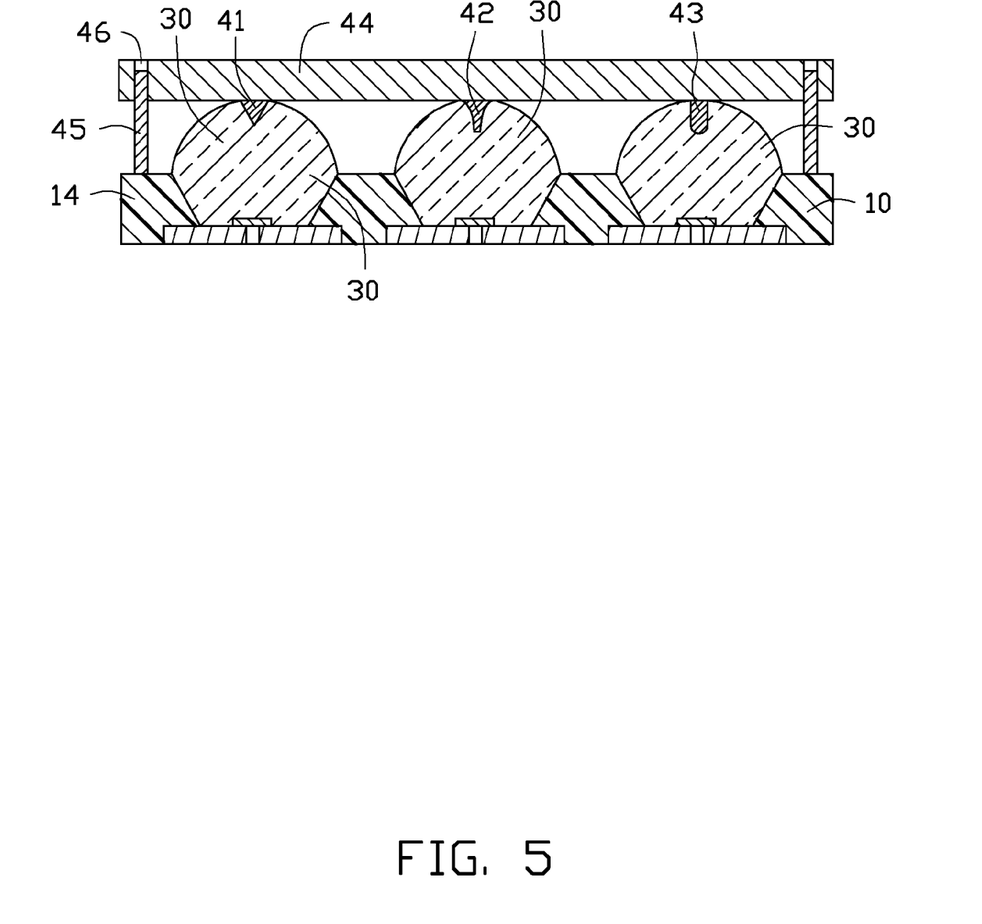
FIG. 5 shows a fifth step of the method for manufacturing the LED with bat-wing emitting field lens in accordance with the first embodiment of the present disclosure.

As shown in FIG. 5, the pressing mold 40 is moved towards the substrate 10 until the first protrusion 41, the second protrusion 42 and the third protrusion 43 are inserted into the lenses 30. Before this, when the first, second and third protrusions 41, 42, 43 are moved downward to touch tops of the lenses 30, bottom ends of the rods 45 touch the substrate 10. Thereafter, the first protrusion 41, the second protrusion 42 and the third protrusion 43 are moved towards the lenses 30 and inserted into the unsolidified lenses 30 from the tops of the lenses 30, meanwhile the rods 45 are pushed by the substrate 10 upwardly to slide in the guiding grooves 46 of the supporting plate 44. It is understood that, the three protrusions 41, 42, 43 can insert the lenses 30 in a different depth by adjusting the slideable distance of the rods 45 in the guiding grooves 46 according to an actual requirement. The lenses 30 are still unsolidified at this stage.

Figure 6:
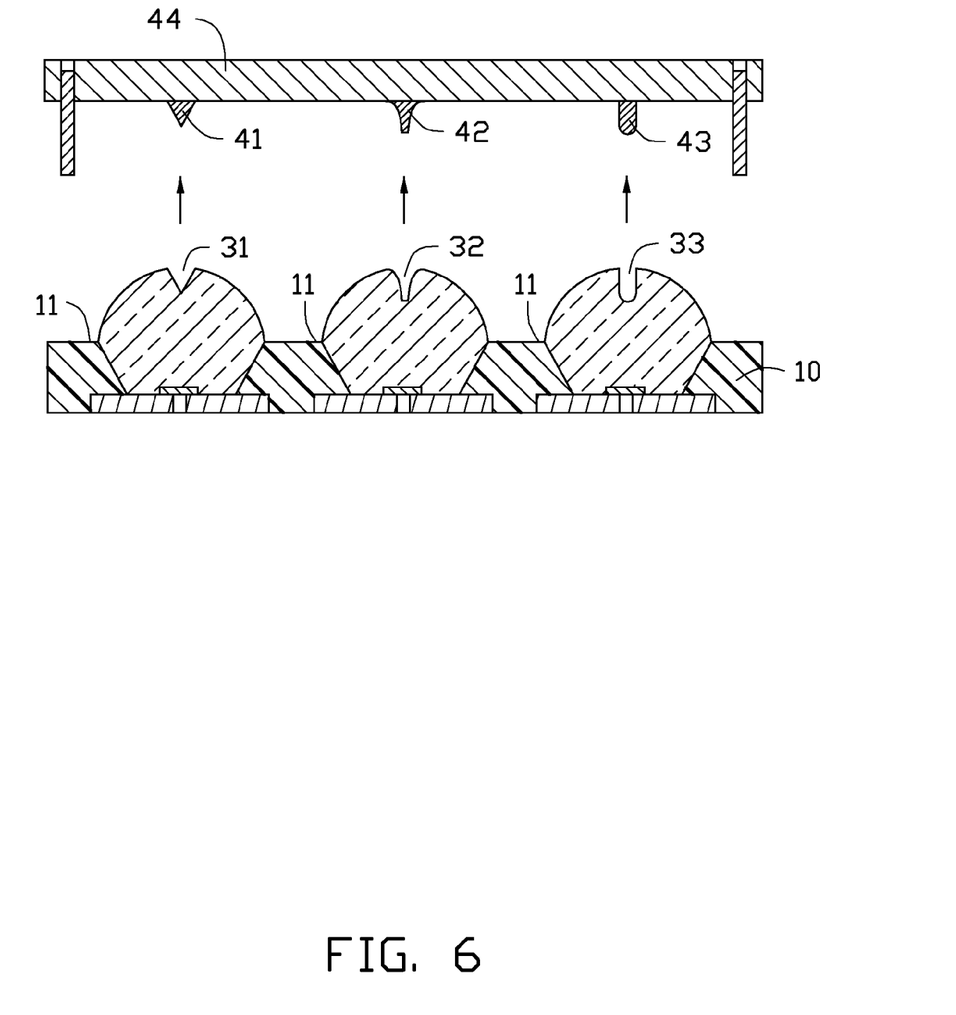
FIG. 6 shows a sixth step of the method for manufacturing the LED with bat-wing emitting field lens in accordance with the first embodiment of the present disclosure.

As shown in FIG. 6, the lenses 30 are solidified and the pressing mold 40 is removed from the lenses 30. The unsolidified lenses 30 are solidified by baking or other method. During the curing process, the first, second and third protrusions 41, 42, 43 are still inserted in the lenses 30. After the lenses 30 are cured, the first protrusion 41, the second protrusion 42 and the third protrusion 43 are moved away from the lenses 30 to separate from the lenses 30, during which the rods 45 slide in the guiding grooves 46 of the supporting plate 44 to return to their original positions. Then the pressing mold 40 is removed.

A first concavity 31, a second concavity 32 and a third concavity 33 are defined in tops of the lenses 30 corresponding to the first protrusion 41, the second protrusion 42 and the third protrusion 43. Shapes of the three concavities 31, 32, 33 are as same as the shapes of the three protrusions 41, 42, 43. Correspondingly, the first concavity 31 is an inverted cone-shaped concavity, the second concavity 32 is a funnel-shaped concavity, and the third concavity 33 is a bullet-shaped concavity. Light from the LED chips 20 is adjusted by the lenses 30, reflected or refracted by the concavities 31, 32, 33, and then emit outside and form bat-wing emitting fields. It is understood that, the three concavities 31, 32, 33 respectively have shapes the same as those of the correspond protrusions 41, 42, 43. Also, it is also understood that the number of the protrusions of the pressing mold 40 is not limited to three, and the shapes of the protrusions of the pressing mold 40 are not limited to the shown inverted cone-shaped, funnel-shaped and bullet-shaped configurations. Any shape of the protrusions which has a bottom acuter than a top can also meet the requirement of the method of the present disclosure.

Figure 7:
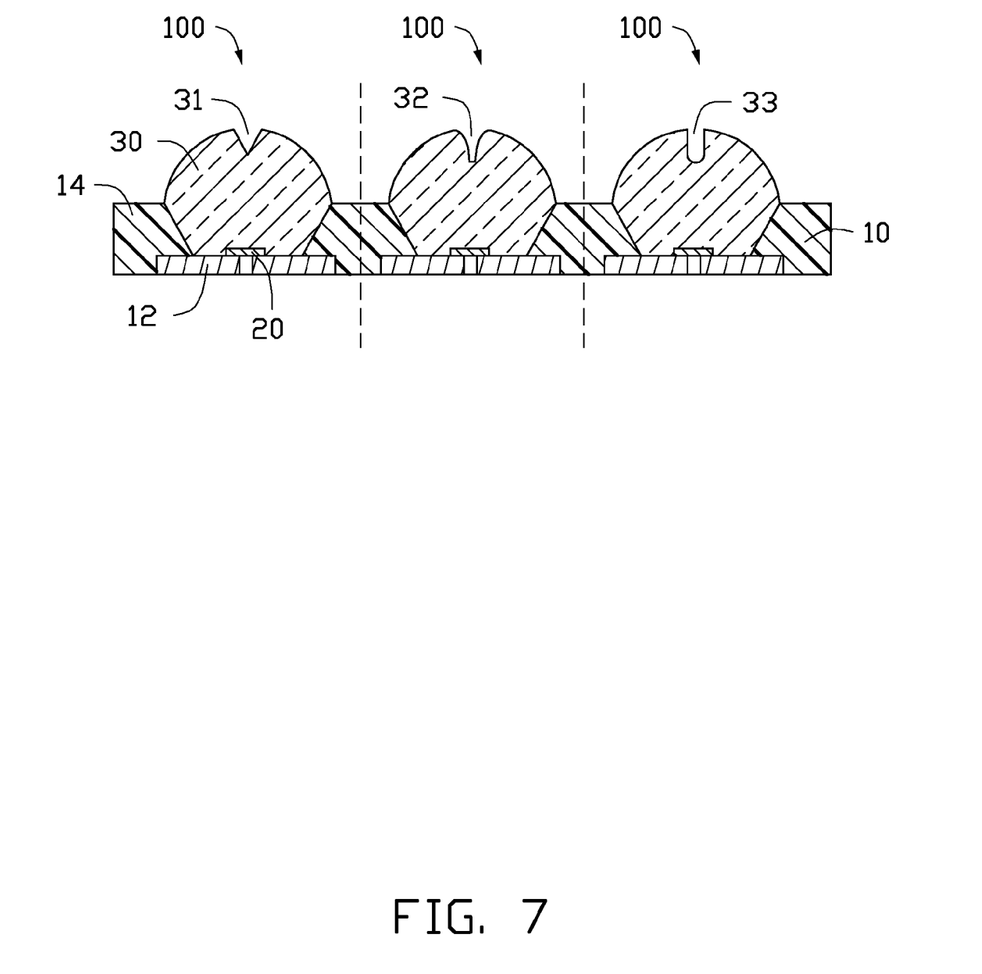
FIG. 7 shows a seventh step of the method for manufacturing the LED with bat-wing emitting field lens in accordance with the first embodiment of the present disclosure.

As shown in FIG. 7, the substrate 10 is cut to contain three individual LEDs 100. Each LED 100 manufactured by the above steps includes the isolating portion 14 defining a corresponding depression 13 and acting as a reflective cup, the pair of electrodes 12, the LED chip 20 and the lens 30 with the concavity which is one of the first concavity 31, the second concavity 32 or the third concavity 33.

The lens 30 of the LED 100 formed by the above steps includes the processing steps of dispensing, pressing and curing. The lens 30 which is formed in the depression 13 and at the same time defined with the concavity 31 in a top thereof is manufactured in a manner of time-saving process. Thus, the LED 100 with such lens 30 can be manufactured fast and easily, thereby meeting a requirement of mass production for the LED 100. The shape of the concavity 31 has multiple choices to meet different requirements. Also thanks to the step of removing the pressing mold 40 after the lenses 30 are cured, special shape of the lenses 30 can be kept without the fear of deformation.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing an LED (light emitting diode) with bat-wing emitting field lens, comprising:
   providing a substrate inlayed with a plurality of pairs of electrodes, the substrate comprising a plurality of depressions each corresponding to a pair of electrodes;
   fastening a plurality of LED chips in the depressions and electrically connecting the plurality of LED chips to the plurality of pairs of electrodes, wherein each LED chip is electrically connected to a corresponding pair of electrodes;
   forming a plurality of unsolidified lenses in the depressions to cover the LED chips;
   providing a pressing mold comprising a plurality of protrusions;
   moving the pressing mold towards the substrate to force the protrusions of the pressing mold to insert into the unsolidified lenses;
   curing the lenses and then removing the pressing mold until the protrusions separate from the lenses, the separations of the protrusions from the lenses leaving a plurality of concavities defined in the lenses; and
   cutting the substrate to obtain a plurality of individual LEDs each including a corresponding pair of electrodes, a corresponding LED chip electrically connected to the corresponding pair of electrodes and a corresponding cured lens covering the corresponding LED chip;
   wherein the pressing mold comprises a supporting plate and the protrusions protruding from a surface of the supporting plate and facing the lenses; and
   wherein the pressing mold further comprises a pair of rods and a pair of guiding grooves, each rod being slidably fixed in a corresponding one of the pair of guiding grooves.

2. The method of claim 1, wherein the plurality of pairs of electrodes are isolated from each other by isolating portions, and the depressions are defined in the isolating portions, each isolating portion functioning as a reflective cup.

3. The method of claim 2, wherein the depressions are inverted cone-shaped, and each pair of electrodes is partially exposed in a corresponding depression.

4. The method of claim 1, wherein during the step of moving the pressing mold towards the substrate to force the protrusions of the pressing mold to insert into the unsolidified lenses, one end of each rod touches the substrate when the protrusions touch tops of the unsolidified lenses, and when the protrusions are forced to move towards the lenses and insert into the unsolidified lenses from the tops of the unsolidified lenses, each rod slides in the corresponding guiding groove of the supporting plate.

5. The method of claim 1, wherein the LED chips are located at central axes of the lenses respectively, and the concavities are also located at the central axes of the lenses respectively.

6. The method of claim 1, wherein each protrusion of the pressing mold is inverted cone-shaped, funnel-shaped or bullet-shaped, and each concavity of a corresponding lens has a same shape as that of a corresponding protrusion inserted into the corresponding lens.

7. The method of claim 1, wherein the unsolidified lenses fully fill the depressions and selectively protrude from the depressions.

8. The method of claim 1, wherein the protrusions are made of material which does not stimulate chemical reaction with the unsolidified lenses and is able to easily separate from the lenses after the lenses are cured, and the lenses are solidified by baking.

9. The method of claim 1, wherein heights of the protrusions are the same.

10. A method for manufacturing an LED (light emitting diode) with bat-wing emitting field lens, comprising:
providing a substrate inlayed with a pair of electrodes, the substrate comprising an isolated portion and a depression defined in the isolating portion;
fastening an LED chip in the depression and electrically connecting the LED chip to the pair of electrodes;
forming an unsolidified lens in the depression to cover the LED chip;
providing a pressing mold comprising a protrusion;
moving the pressing mold towards the substrate to force the protrusion of the pressing mold to insert into the unsolidified lens; and
curing the lens and then removing the pressing mold from the lens with a concavity being defined at the lens by a leaving of the protrusion from the cured lens;
wherein the pressing mold comprises a supporting plate and the protrusions protruding from a surface of the supporting plate and facing the lenses; and
wherein the pressing mold further comprises a pair of rods and a pair of guiding grooves, each rod being slidably fixed in a corresponding one of the pair of guiding grooves.

11. The method of claim 10, wherein during the step of moving the pressing mold towards the substrate to force the protrusion of the pressing mold to insert into the unsolidified lens, one end of each rod touches the substrate when the protrusion touches a top of the unsolidified lens, and when the protrusion is forced to move towards the lens and insert into the unsolidified lens from the top of the unsolidified lens, each rod slides in the corresponding guiding groove of the supporting plate.

12. The method of claim 10, wherein the LED chip is located at a central axis of the lens and the concavity is also defined at a location coincident with the central axis of the lens.

13. The method of claim 10, wherein the protrusion of the pressing mold is inverted cone-shaped, funnel-shaped or bullet-shaped, and the concavity of the lens has a same shape as the protrusion.

14. The method of claim 10, wherein the unsolidified lens fully fills the depression and selectively protrudes from the depression.

15. The method of claim 10, wherein the protrusion is made of metal and the lens is solidified by baking.

16. A method for manufacturing an LED (light emitting diode) with bat-wing emitting field lens, comprising:
providing a substrate inlayed with a plurality of pairs of electrodes, the substrate comprising a plurality of depressions each corresponding to a pair of electrodes;
fastening a plurality of LED chips in the depressions and electrically connecting the plurality of LED chips to the plurality of pairs of electrodes, wherein each LED chip is electrically connected to a corresponding pair of electrodes;
forming a plurality of unsolidified lenses in the depressions to cover the LED chips;
providing a pressing mold comprising a plurality of protrusions;
moving the pressing mold towards the substrate to force the protrusions of the pressing mold to insert into the unsolidified lenses;
curing the lenses and then removing the pressing mold until the protrusions separate from the lenses, the separations of the protrusions from the lenses leaving a plurality of concavities defined in the lenses; and
cutting the substrate to obtain a plurality of individual LEDs each including a corresponding pair of electrodes, a corresponding LED chip electrically connected to the corresponding pair of electrodes and a corresponding cured lens covering the corresponding LED chip;
wherein the pressing mold comprises a pair of rods and a pair of guiding grooves, each rod being slidably fixed in a corresponding one of the pair of guiding grooves; and
wherein during the step of moving the pressing mold towards the substrate to force the protrusions of the pressing mold to insert into the unsolidified lenses, one end of each rod touches the substrate when the protrusions touch tops of the unsolidified lenses, and when the protrusions are forced to move towards the lenses and insert into the unsolidified lenses from the tops of the unsolidified lenses, each rod slides in the corresponding guiding groove.

* * * * *